(12) United States Patent
Mashimo

(10) Patent No.: US 6,501,341 B2
(45) Date of Patent: Dec. 31, 2002

(54) VOLTAGE CONTROLLED OSCILLATOR AND COMMUNICATION DEVICE USING SAME

(75) Inventor: Yoshiyuki Mashimo, Komatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/747,657

(22) Filed: Dec. 26, 2001

(65) Prior Publication Data

US 2001/0007437 A1 Jul. 12, 2001

(30) Foreign Application Priority Data

Dec. 24, 1999 (JP) .............................. 11-366318

(51) Int. Cl.[7] .............................. H03B 5/18; H03B 1/00
(52) U.S. Cl. ................. 331/96; 331/117 D; 331/108 D; 331/107 SL; 331/177 V; 331/74; 455/318
(58) Field of Search ........................... 331/96, 99, 100, 331/117 R, 117 FE, 117 D, 108 D, 107 SL, 177 V, 187, 74; 455/318

(56) References Cited

U.S. PATENT DOCUMENTS 5,705,960 A * 1/1998 Izumiyama .................. 333/26

* cited by examiner

Primary Examiner—David Mis
(74) Attorney, Agent, or Firm—Keating & Bennett, LLP

(57) ABSTRACT

A voltage control oscillation circuit is provided on the respective layers of a ceramic multilayer substrate, and an unbalanced transmission line and a balanced transmission line are provided to sandwich a predetermined ceramic layer, whereby an unbalance-balance conversion circuit is defined due to the mutual induction coupling between the transmission lines.

13 Claims, 5 Drawing Sheets

COMPONENT MOUNTING SURFACE

GROUND ELECTRODE

RESONATOR POWER SUPPLY LINE

GROUND ELECTRODE

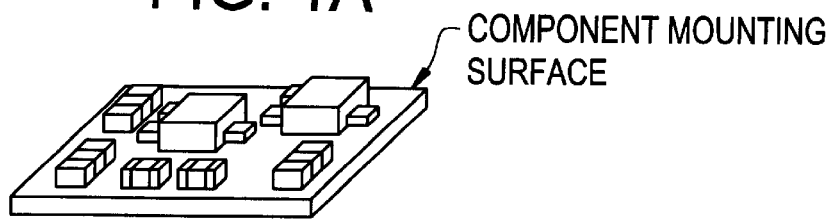
FIG. 1A — COMPONENT MOUNTING SURFACE
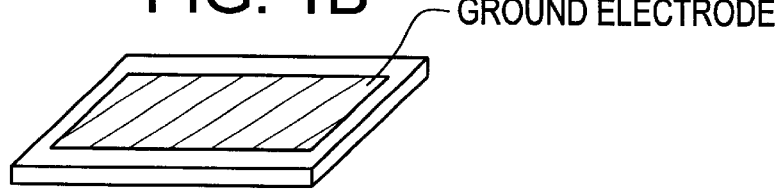
FIG. 1B — GROUND ELECTRODE
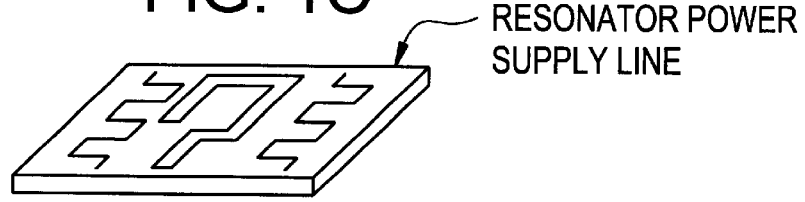
FIG. 1C — RESONATOR POWER SUPPLY LINE
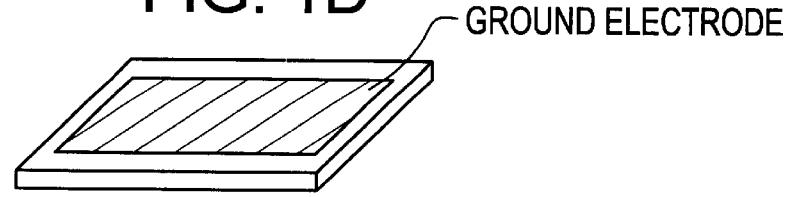
FIG. 1D — GROUND ELECTRODE
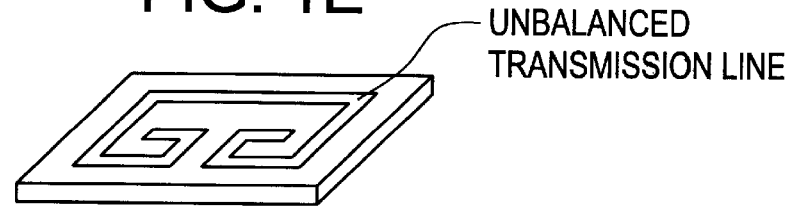
FIG. 1E — UNBALANCED TRANSMISSION LINE
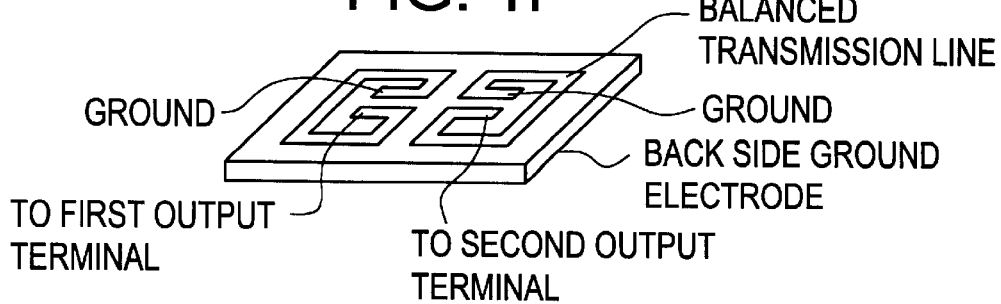
FIG. 1F — BALANCED TRANSMISSION LINE, GROUND, GROUND, BACK SIDE GROUND ELECTRODE, TO FIRST OUTPUT TERMINAL, TO SECOND OUTPUT TERMINAL

UNBALANCED SIGNAL

FIRST OUTPUT TERMINAL

SECOND OUTPUT TERMINAL

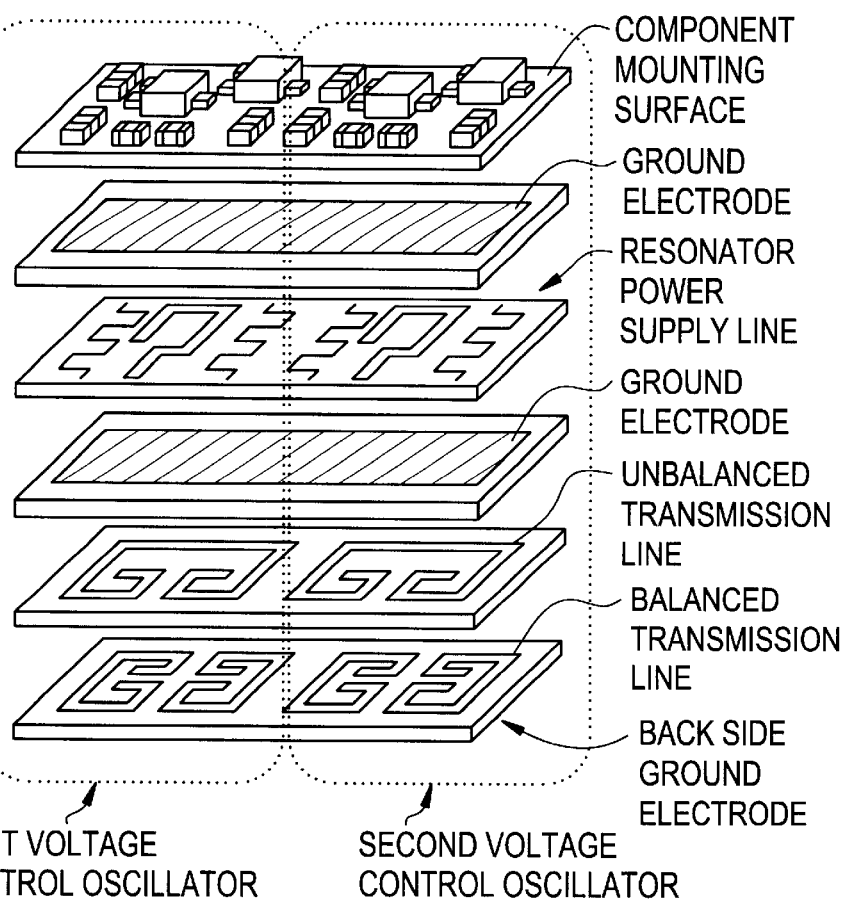
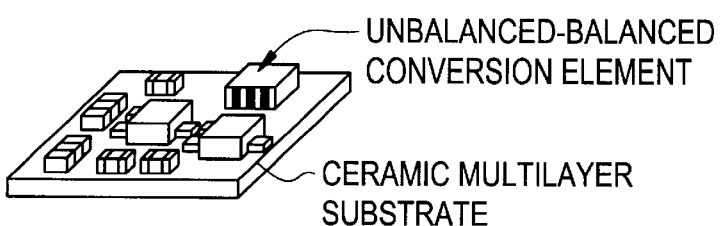
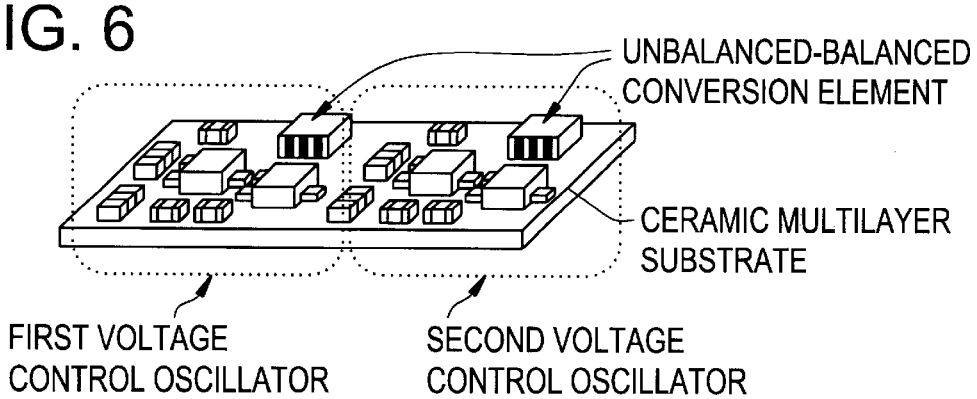

VOLTAGE CONTROLLED OSCILLATOR AND COMMUNICATION DEVICE USING SAME

BACKGROUND OF THE INVENTION

1. Field of the Invention

The present invention relates to a voltage controlled oscillator for use in a communication device, and a communication device including the same.

2. Description of the Related Art

A PLL circuit containing a voltage controlled oscillator in a local oscillation circuit is provided, for example, in a communication device such as a terminal, a transceiver, or other suitable device, such as in a mobile communication system such as portable telephones or other suitable mobile communication system.

FIG. 8 shows an example of a conventional voltage controlled oscillator. In FIG. 8, an oscillation circuit includes a transistor Tr2, resistors connected to the transistor Tr2, capacitors, a resonator, a variable capacitance diode VD defined by a voltage variable reactance element. An oscillation signal is output from a buffer stage including a transistor Tr1 via a capacitor C2. The oscillation frequency is changed with an electrostatic capacitance of the variable capacitance diode VD, which is changed via a control voltage applied to a control terminal.

In a high frequency circuit, to suppress effects of undesired radiation from the high frequency circuit and external noises, a high frequency signal is processed in a balance signal mode because this method includes two signal lines defined by transmission lines for balanced signals which equally receive external noises, such that no noises from the balance mode are generated, and also, signals radiated outside from the two signal lines are cancelled.

Such balanced signals are provided by dividing an unbalanced signal into two signals, and shifting the phase of one signal by 180° with respect to that of the other signal. Regarding a method of inverting the phase, an emitter follower circuit is provided, and a signal is input to the base of the transistor and is output from the emitter. However, even if an emitter follower circuit which operates in a frequency band of at least 800 MHz used in a mobile communication system is provided, it is difficult to shift the phase exactly by 180° in the emitter follower circuit, due to effects of the internal parasitic capacitance and the parasitic inductance of the transistor.

When an output signal from a conventional voltage controlled oscillator as shown in FIG. 8 is processed as an unbalanced signal, it is necessary to convert the unbalanced signal to balanced signals via an unbalance-balance converter including a balun transformer.

Accordingly, the unbalance-balance converter including a balun transformer is disposed in a high frequency circuit section in addition to a voltage controlled oscillator module. Thus, the number of components is increased, and the area occupied by the high frequency circuit section on a printed circuit board or other substrate of a communication device is substantially increased, which increases the overall size of the device.

SUMMARY OF THE INVENTION

To overcome the above-described problems with the prior art, preferred embodiments of the present invention provide a voltage controlled oscillator which processes an oscillation output signal as balanced signals without an unbalance-balance converter being separately provided, and a communication device including the same.

According to preferred embodiments of the present invention, a voltage controlled oscillator includes an oscillation circuit having an active element and a voltage variable reactance element provided on a ceramic multilayer substrate, and an unbalance-balance conversion circuit mounted onto the upper surface of the ceramic multilayer substrate. Thereby, the voltage controlled oscillator including the ceramic multilayer substrate and balance-outputs oscillation signals is provided as a single component.

Moreover, according to preferred embodiments of the present invention, a voltage controlled oscillator includes an oscillation circuit having an active element and a voltage variable reactance element provided on a ceramic multilayer substrate, and an unbalance-balance conversion circuit defined by transmission lines sandwiching a desired ceramic layer of the ceramic multilayer substrate. Thereby, the desired layer of the ceramic multilayer substrate operates as the unbalance-balance converter. In the voltage controlled oscillator having the above-described configuration, no unbalance-balance conversion element is required to be mounted on the component-mounting surface of the ceramic multilayer substrate. Thus, a separate mounting area is not needed for the unbalance-balance conversion element. Therefore, the size of the component is greatly reduced.

In the voltage controlled oscillator of other preferred embodiments of the present invention, a plurality of sets of the oscillation circuit and the unbalance-balance conversion circuit, corresponding to each frequency, are provided on the ceramic multilayer substrate.

A conventional voltage controlled oscillator is provided with a single oscillation output terminal. On the contrary, with the configuration according to preferred embodiments of the present invention, oscillation signals corresponding to frequency bands and to be balance-output are used.

The communication device of other preferred embodiments of the present invention is provided with the voltage controlled oscillator having one of the above-described configurations, for example, by providing a PLL circuit which is a local oscillation circuit.

The features, characteristics, elements and advantages of the present invention will be clear from the following detailed description of preferred embodiments of the invention in conjunction with the accompanying drawings.

BRIEF DESCRIPTION OF THE DRAWINGS

FIG. 1 is an exploded perspective view of a voltage controlled oscillator according to a first preferred embodiment of the present invention;

FIG. 4 is an exploded perspective view showing the configuration of a voltage controlled oscillator according to a second preferred embodiment of the present invention;

FIG. 5 is a perspective view showing the appearance of a voltage controlled oscillator according to a third preferred embodiment of the present invention;

FIG. 6 is a perspective view showing the appearance of a voltage controlled oscillator according to a fourth preferred embodiment of the present invention;

DETAILED DESCRIPTION OF PREFERRED EMBODIMENTS

A voltage controlled oscillator according to a first preferred embodiment will be described with reference to FIGS. 1 to 3.

FIG. 1 is an exploded perspective view showing an electrode pattern provided on each layer of a ceramic multilayer substrate defining the voltage controlled oscillator. The upper surface of the uppermost layer shown in FIG. 1A is a component-mounting surface. A resistor, a capacitor, a variable capacitance diode, and a chip component such as a transistor or other suitable component, which are surface mounted on the ceramic multilayer substrate. In FIGS. 1B and 1D, GND (ground) electrodes are provided. On the layer shown in FIG. 1C, sandwiched between the layers of FIGS. 1B and 1D, a transmission line defined by a resonator and a power supply line are provided. The transmission line defined by a resonator and the upper and lower GND electrodes define a strip line resonator. An unbalanced transmission line is provided on the layer shown in FIG. 1E, and a balanced transmission line is provided on the layer shown in FIG. 1F. A GND electrode is provided on the entire area of the back surface of the layer shown in FIG. 1F excluding a terminal electrode formation portion. Thus, the unbalanced transmission line and the balanced transmission line are opposed to each other and define a planar balun transformer.

Figure 2:
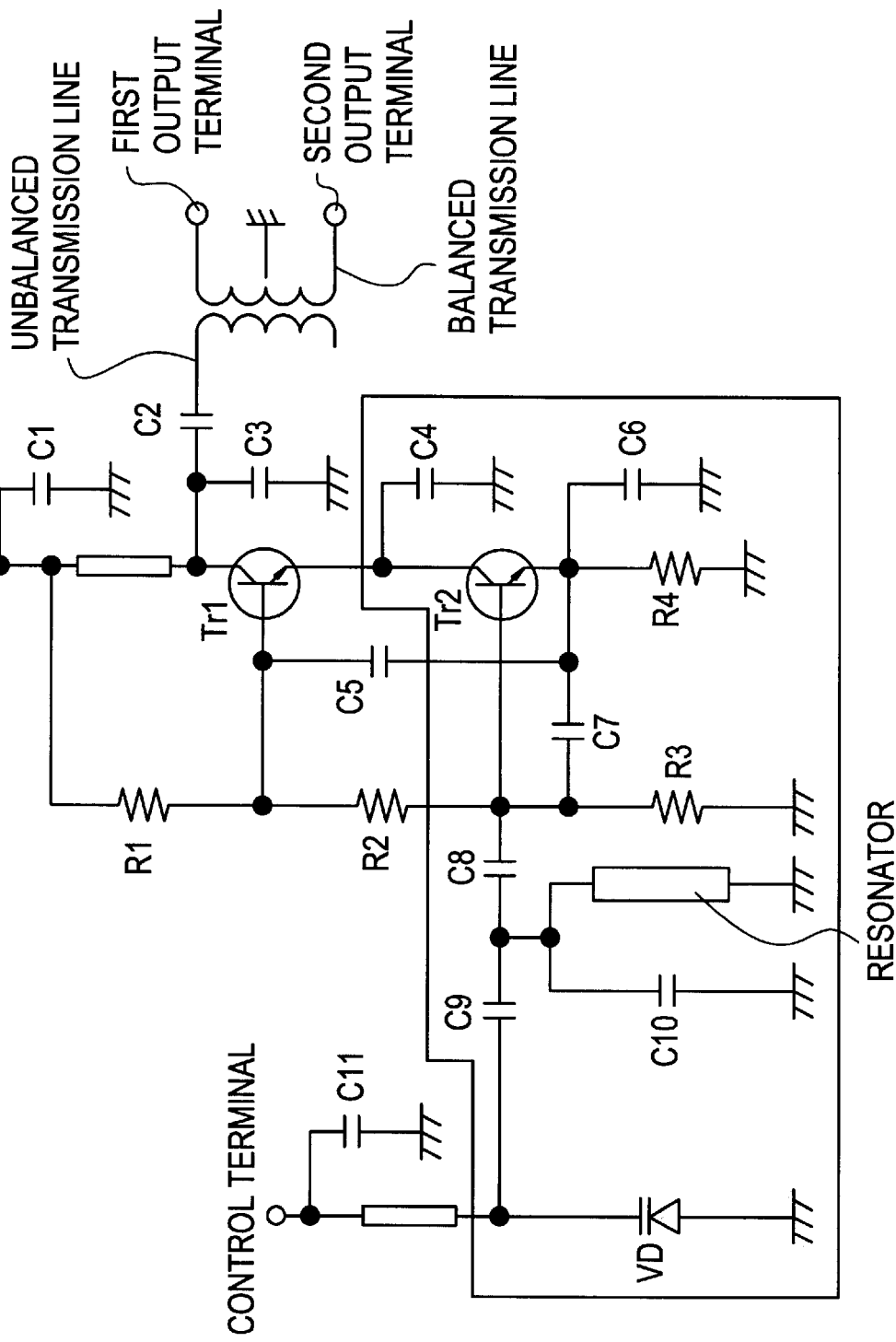
FIG. 2 is a circuit diagram of the voltage controlled oscillator.

FIG. 2 is a circuit diagram of the voltage controlled oscillator of this preferred embodiment. An oscillation stage including a modified Colpitts oscillation circuit surrounded by a solid line is shown in the circuit diagram of FIG. 2. The major portion of the oscillation circuit includes capacitors C6, C7, C8, C9, and C10, a variable capacitance diode VD, a resonator defined by the above-described microstrip lines, and a transistor Tr2. Resistors R1, R2, and R3 define a base bias circuit for the transistors Tr1 and Tr2. With a bypass capacitor C4, the collector of the transistor Tr2 is high-frequency grounded, and thereby, the capacitor C6 is equivalently connected between the collector-emitter of the transistor Tr2. From the control terminal, a control voltage is applied to the variable capacitance diode VD via the strip line provided inside of the above-described multilayer substrate. The electrostatic capacitance is varied corresponding to the control voltage, which changes the oscillation frequency. The transistor Tr1 includes a buffer stage. A supply voltage is applied to the collector of the transistor Tr1 via an inductor defined by the strip line provided inside of the ceramic multilayer substrate. A capacitor C5 is connected between the emitter of the transistor Tr2 and the base of the transistor Tr1. An unbalanced signal is supplied from the collector of Tr1 to the unbalanced transmission line via a capacitor 2. Furthermore, high frequency bypass capacitors C1 and C11, and a tuning capacitor C3 are provided.

The balanced transmission line and the unbalanced transmission line are mutual induction coupled to each other. Since the position corresponding to the center tap of the balanced transmission line is grounded, balanced signals are output from the first and second output terminals at both ends of the balanced transmission line.

In the unbalanced transmission line shown in FIG. 2, the end of the line on the side where the capacitor C2 is not connected is open, and the output impedance, calculated from the capacitor C2 side, is designed to obtain the output impedance (e.g., 50 Ω) from the voltage controlled oscillator.

Figure 3A:
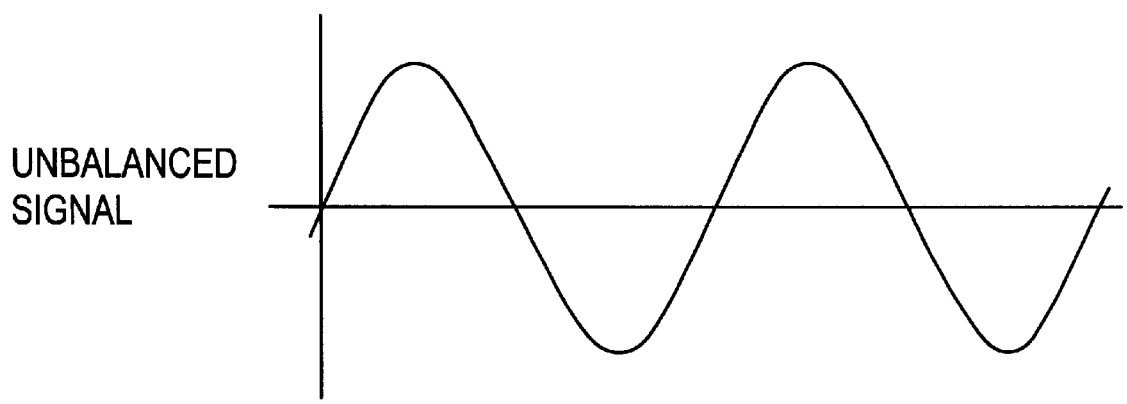
FIG. 3 is a waveform chart at the output of the voltage controlled oscillator.
Figure 3B:
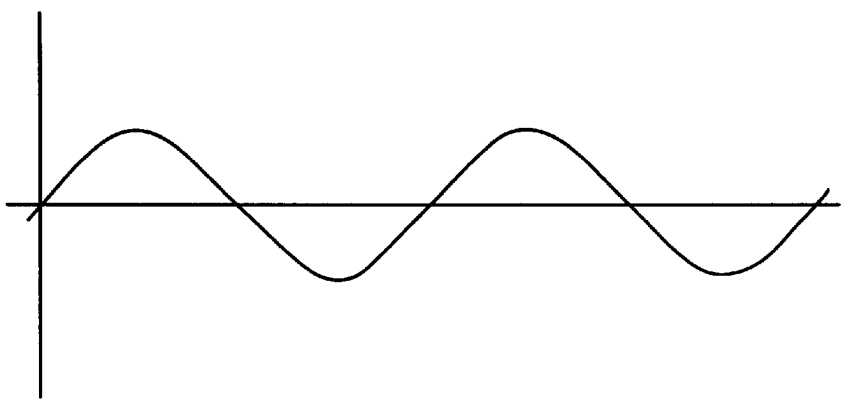
Figure 3C:
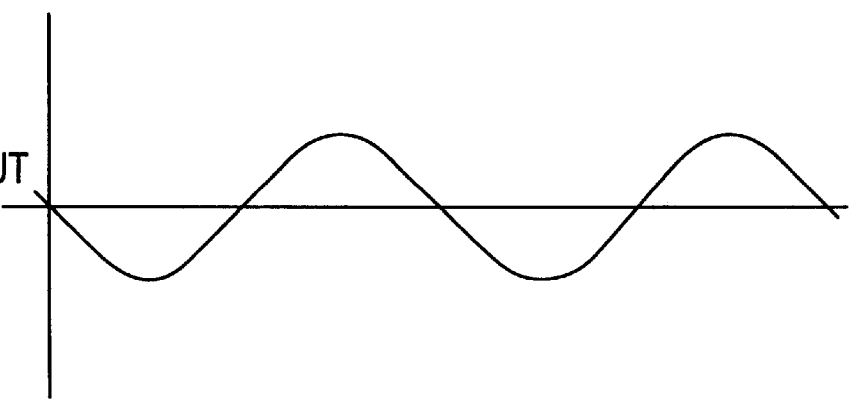

FIG. 3 shows, in waveforms, the relationship between input-output signals of the unbalanced and balanced conversion circuit including the unbalanced transmission line and the balanced transmission line shown in FIG. 2. FIG. 3A shows an output signal from the capacitor 2 shown in FIG. 2. FIGS. 3B and 3C show output signals from the first and second output terminals, respectively.

With the voltage controlled oscillator having the above-described configuration, an oscillation signal is directly output in a balance signal mode by mounting only the oscillator to the circuit board or substrate of a communication device.

FIG. 4 shows the configuration of a voltage controlled oscillator according to a second preferred embodiment. In the first preferred embodiment, the voltage controlled oscillation circuit to output one set of balanced outputs is provided. In the example of FIG. 4, two sets including the voltage controlled oscillation circuit and the balanced output terminals are provided on a ceramic multilayer substrate. That is, on the uppermost layer defining the component-mounting surface, shown in IG.4A, resistors, capacitors, variable capacitance diodes, and chip components such as transistors or other suitable components are surface-mounted for two sets each including the voltage control oscillation circuit. As shown in FIGS. 4B and 4D, GND electrodes are provided. On the layer shown in FIG. 4C between the layers shown in FIGS. 4B and 4D, transmission lines and supply lines defining two resonators for use in two sets each including the voltage control oscillation circuit are provided. On the layers shown in FIGS. 4E and 4F, unbalanced transmission lines and balanced transmission lines for use in the two sets each including the voltage control oscillation circuit are provided. A GND electrode is provided on the entire area on the back surface of the layer shown in FIG. 4F, excluding terminal electrode formation portions. Thus, the unbalanced transmission lines and the unbalanced transmission lines are opposed to each other including a planar balun transformer.

The voltage controlled oscillator having the above-described configuration are used as two sets each including the voltage control oscillation circuit to operate in different frequency bands and balance-output oscillation signals, respectively.

Next, the configuration of a voltage controlled oscillator according to a third preferred embodiment will be described with reference to FIG. 5.

FIG. 5 is a perspective view showing the appearance of the oscillator. On the upper surface of a ceramic multilayer substrate, an unbalance-balance conversion element, together with a resistor, a capacitor, a variable capacitance diode, and a chip component such as a transistor or other suitable components, are mounted. On a portion of the side surfaces and bottom surface of the ceramic multilayer substrate, a control terminal for applying a voltage signal for the purpose of frequency control, a supply terminal, and balanced output terminals are provided. Accordingly, by surface-mounting this voltage controlled oscillator on the circuit board or substrate of a communication device, the oscillator is connected to a balanced transmission line without an unbalance-balance conversion device being externally mounted.

FIG. 6 is a perspective view showing the appearance of a voltage controlled oscillator according to a fourth preferred embodiment of the present invention. In the example of FIG. 5, one set including a voltage control oscillation circuit and a unbalance-balance conversion circuit is provided. On the other hand, two sets each including the voltage control oscillation circuit and the unbalance-balance conversion circuit are provided. That is, the configuration of the first voltage controlled oscillator and that of the second voltage controlled oscillator in FIG. 6 are the same as that of the voltage controlled oscillator shown in FIG. 5, respectively, and are mounted on a single ceramic multilayer substrate. A PLL circuit and a local oscillation circuit suitable to operate in two frequency bands are easily provided via this voltage controlled oscillator.

Figure 7:
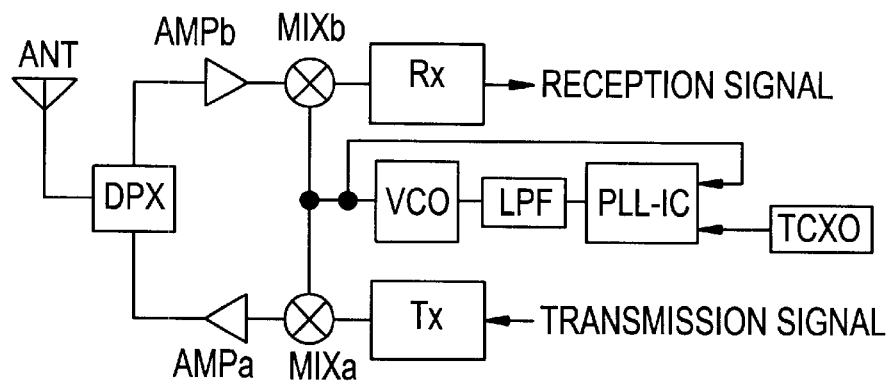
FIG. 7 is a perspective view showing the appearance of a voltage controlled oscillator according to a fifth preferred embodiment of the present invention.
Figure 8:
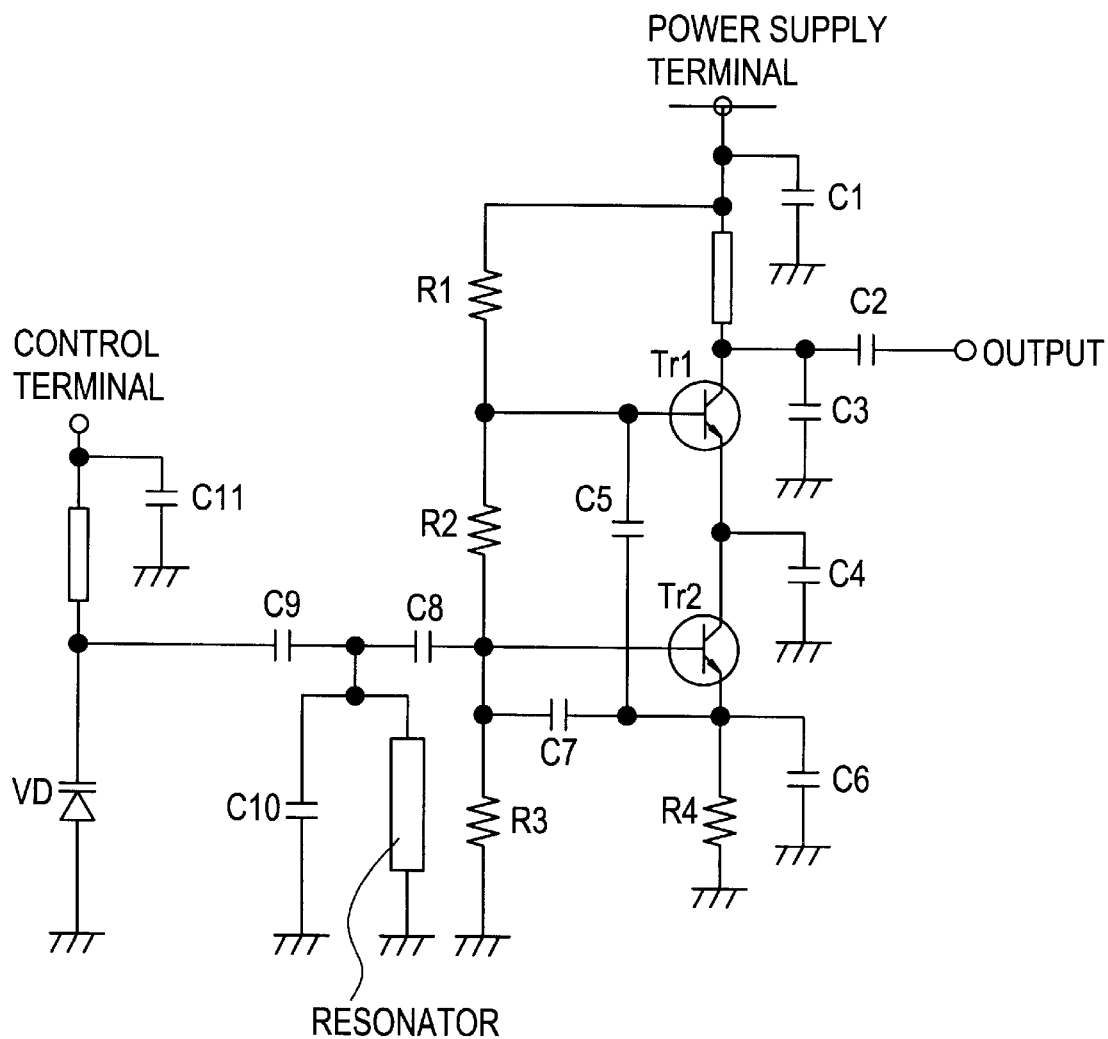
FIG. 8 is a circuit diagram of a conventional voltage controlled oscillator.

FIG. 7 is a block diagram showing an example of the configuration of the communication device. In FIG. 7, a voltage controlled oscillator VCO, and a PLL control circuit PLL-IC are shown. An output signal from the voltage controlled oscillator VCO is supplied in a balanced transmission mode to the PLL control circuit PLL-LC, in which the phase of the signal is compared with that of an oscillation signal from a temperature compensation quartz oscillation circuit TCXO, and outputs a control signal to obtain a desired frequency and phase. The oscillator VCO receives a control voltage at the control terminal thereof via a low-pass filter LPF, and oscillates at a frequency corresponding to the control voltage. The oscillation output signal is provided as local oscillation signals to balanced input type mixers MIXa and MIXb. The mixer circuit MIXa mixes the local oscillation signal with an intermediate frequency signal output from a transmission circuit Tx for frequency-conversion to produce a transmission frequency signal. The signal is power amplified in an amplification circuit AMPa, and is radiated from an antenna ANT via a duplexer DPX. A reception signal, passed via the antenna ANT and the duplexer DPX, is amplified in an amplification circuit AMPb. The mixer circuit MIXb mixes the balanced output signals from the amplification circuit AMPb with the above-mentioned local oscillation signal for conversion to produce an intermediate frequency signal. The reception circuit Rx signal-processes the intermediate frequency signal to produce a reception signal.

With such a communication device, it is unnecessary to mount the unbalance-balance converter together with the voltage controlled oscillator VCO on the circuit board or substrate. Accordingly, the number of components is greatly reduced, and the overall size of the device is greatly reduced.

The voltage controlled oscillators in accordance with first and second preferred embodiments of the present invention operate as a single component to balance-output an oscillation signal, respectively. Accordingly, when the voltage controlled oscillator is mounted onto the circuit board or substrate of a communication device, it is not necessary to separately mount an unbalance balance converter for converting an oscillation output signal to its balanced transmission mode. Thus, the number of components is greatly reduced, and moreover, the overall size of the device is greatly reduced.

Especially, in the voltage controlled oscillator in accordance with the second preferred embodiment of the present invention, it is not necessary to provide a separate mounting area on the ceramic multilayer substrate for an unbalance-balance conversion element. Thus, the overall size of the voltage controlled oscillator is greatly reduced.

Preferably, in the voltage controlled oscillator, oscillation signals to be balance-output correspondingly to frequency bands are used. The number of required components is further reduced. Further the overall size of the device is further reduced.

In the communication device of the present invention, the number of components is greatly reduced. For example, the size of a PLL circuit, which is a local oscillation circuit, is greatly reduced. Thus, the overall size of the device is greatly reduced.

While the invention has been described in its preferred embodiments, obviously, numerous modifications and variations of the present invention are possible in light of the above teachings. It is therefore to be understood that within the scope of the appended claims, the invention may be practiced otherwise than as specifically described.

What is claimed is:

1. A voltage controlled oscillator comprising:

a ceramic multilayer substrate including a plurality of ceramic layers;

an oscillation circuit including an active element and a voltage variable reactance element provided on the ceramic multilayer substrate;

an unbalance-balance conversion circuit mounted onto the upper surface of the ceramic multilayer substrate;

a balanced transmission line and a ground electrode provided on opposite surfaces of one of the plurality of ceramic layers; and an unbalanced transmission line provided on another of the plurality of ceramic layers adjacent to the one of the plurality of ceramic layers.

2. A voltage controlled oscillator according to claim 1, wherein a plurality of sets of the oscillation circuit and the unbalance-balance conversion circuit, corresponding to respective frequencies, are provided on the ceramic multilayer substrate.

3. A communication device including the voltage controlled oscillator according to claim 1.

4. A voltage controlled oscillator according to claim 1, wherein said oscillation circuit includes a resistor, a capacitor, a variable capacitance diode, and a chip component surface mounted on said ceramic multilayer substrate.

5. A voltage controlled oscillator according to claim 1, further including ground electrodes, a transmission line defined by a resonator and a power supply line.

6. A voltage controlled oscillator according to claim 1, wherein said oscillation circuit is a modified Colpitts oscillation circuit.

7. A voltage controlled oscillator according to claim 4, wherein said resistor is defined by microstrip lines.

8. A voltage controlled oscillator comprising:

a ceramic multilayer substrate including a plurality of ceramic layers stacked in a thickness direction;

an oscillation circuit including an active element and a voltage variable reactance element provided on the ceramic multilayer substrate;

an unbalance-balance conversion circuit mounted onto the upper surface of the ceramic multilayer substrate; and a first ground electrode, a resonator and a power supply line, a second ground electrode, an unbalanced transmission line, and a balanced transmission line provided in order on respective ones of the plurality of ceramic layers in the thickness direction.

9. A voltage controlled oscillator according to claim 8, wherein a plurality of sets of the oscillation circuit and the unbalance-balance conversion circuit, corresponding to respective frequencies, are provided on the ceramic multilayer substrate.

10. A communication device including the voltage controlled oscillator according to claim 8.

11. A voltage controlled oscillator according to claim 8, wherein said oscillation circuit includes a resistor, a capacitor, a variable capacitance diode, and a chip component surface mounted on said ceramic multilayer substrate.

12. A voltage controlled oscillator according to claim 8, wherein said oscillation circuit is a modified Colpitts oscillation circuit.

13. A voltage controlled oscillator according to claim 11, wherein said resistor is defined by microstrip lines.

\* \* \* \* \*